(12) United States Patent
Kramer et al.

(10) Patent No.: US 6,652,363 B2
(45) Date of Patent: Nov. 25, 2003

(54) METHOD AND APPARATUS FOR UNIFORMLY PLANARIZING A MICROELECTRONIC SUBSTRATE

(75) Inventors: Stephen J. Kramer, Boise, ID (US); Scott Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/121,826

(22) Filed: Apr. 11, 2002

(65) Prior Publication Data

US 2002/0111123 A1 Aug. 15, 2002

Related U.S. Application Data

(62) Division of application No. 09/748,953, filed on Dec. 26, 2000, now Pat. No. 6,450,863, which is a continuation of application No. 09/244,948, filed on Feb. 4, 1999, now Pat. No. 6,176,763.

(51) Int. Cl.$^7$ .............................. B24B 1/00; B24B 29/00
(52) U.S. Cl. ..................... 451/41; 451/285; 451/287; 451/307; 451/308; 451/309
(58) Field of Search ....................... 451/41, 285, 287, 451/60, 446; 51/307, 308, 309

(56) References Cited

U.S. PATENT DOCUMENTS

| | | | |
|---|---|---|---|
| 3,916,584 A | 11/1975 | Howard et al. | 51/308 |
| 5,177,908 A | 1/1993 | Tuttle | 51/283 R |
| 5,230,833 A | 7/1993 | Romberger et al. | 252/363.5 |
| 5,391,210 A | 2/1995 | Bilkadi et al. | 51/298 |
| 5,489,233 A | 2/1996 | Cook et al. | 451/41 |
| 5,496,386 A | 3/1996 | Broberg et al. | 51/295 |
| 5,645,471 A | 7/1997 | Strecker | 451/59 |
| 5,840,090 A | 11/1998 | Ho et al. | 51/295 |
| 5,891,205 A | 4/1999 | Picardi et al. | 51/308 |
| 6,176,763 B1 * | 1/2001 | Kramer et al. | 451/41 |
| 6,450,863 B2 * | 9/2002 | Kramer et al. | 451/41 |

OTHER PUBLICATIONS

Brochure; Cabot Corporation, "CAB–9–SIL Untreated Fumed Silica Properties and Functions", 1993.

* cited by examiner

Primary Examiner—M. Rachuba
(74) Attorney, Agent, or Firm—Dorsey & Whitney LLP

(57) ABSTRACT

A method and apparatus for planarizing a microelectronic substrate. The apparatus can include a planarizing medium having a relatively hard polishing pad and a planarizing liquid disposed on a generally non-porous planarizing surface of the polishing pad. The planarizing liquid can include a colloidal suspension of colloidal particles having generally smooth external surfaces. The colloidal particles can have a variety of shapes, including a spherical shape, a cylindrical shape, a cubic shape, and a hexagonal shape, among others. The colloidal particles can be formed from a variety of materials, including silicon dioxide, manganese oxide, and cerium oxide.

5 Claims, 4 Drawing Sheets

METHOD AND APPARATUS FOR UNIFORMLY PLANARIZING A MICROELECTRONIC SUBSTRATE

CROSS-REFERENCE TO RELATED APPLICATIONS

This application is a divisional of pending U.S. patent application Ser. No. 09/748,953, filed Dec. 26, 2000, now U.S. Pat. No. 6,450,863, which is a continuation of U.S. patent application Ser. No. 09/244,948, filed Feb. 4, 1999, now issued as U.S. Pat. No. 6,176,763.

TECHNICAL FIELD

The present invention relates to methods and apparatuses for uniformly planarizing a microelectronic substrate using a chemical-mechanical planarization process.

BACKGROUND OF THE INVENTION

Mechanical and chemical-mechanical planarizing processes (collectively "CMP") are used in the manufacture of microelectronic devices to form a flat surface on semiconductor wafers, field emission displays; and many other microelectronic substrates. FIG. 1 schematically illustrates a planarizing machine 10 with a table or platen 20, a carrier assembly 30 above the platen 20, a polishing pad 21 positioned on the platen 20, and a planarizing fluid 23 on the polishing pad 21. The planarizing machine 10 may also have an under-pad 25 attached to an upper surface 22 of the platen 20 for supporting the polishing pad 21. In many planarizing machines, a platen drive assembly 26 rotates (arrow A) and/or reciprocates (arrow B) the platen 20 to move the polishing pad 21 during planarization.

The carrier assembly 30 controls and protects a substrate 80 during planarization. The carrier assembly 30 typically has a substrate holder 32 with a pad 34 that holds the substrate 80 via suction. A carrier drive assembly 36 typically translates (arrow C) and/or rotates (arrow D) the substrate holder 32. Alternatively, the substrate holder 32 may be a weighted, free-floating disk (not shown) that slides over the polishing pad 21. The combination of the polishing pad 21 and the planarizing fluid 23 generally defines a planarizing medium 28 that mechanically and/or chemically-mechanically removes material from the surface of the substrate 80. The polishing pad 21 may be a conventional polishing pad composed of a polymeric material (e.g., polyurethane) without abrasive particles, or it may be an abrasive polishing pad with abrasive particles fixedly bonded to a suspension material. In a typical application, the planarizing fluid 23 may be a CMP slurry with abrasive particles and chemicals for use with a conventional non-abrasive polishing pad. In other applications, the planarizing fluid 23 may be a chemical solution without abrasive particles for use with an abrasive polishing pad.

To planarize the substrate 80 with the planarizing machine 10, the carrier assembly 30 presses the substrate 80 against a planarizing surface 24 of the polishing pad 21 in the presence of the planarizing fluid 23. The platen 20 and/or the substrate holder 32 move relative to one another to translate the substrate 80 across the planarizing surface 24. As a result, the abrasive particles and/or the chemicals in the planarizing medium 28 remove material from the surface of the substrate 80.

CMP processes must consistently and accurately produce a uniform planar surface on the substrate to enable precise fabrication of circuits and photo-patterns. Prior to being planarized, many substrates have large "step heights" that create a highly topographic surface across the substrate. Yet, as the density of integrated circuits increases, it is necessary to have a planar substrate surface at several stages of substrate processing because non-uniform substrate surfaces significantly increase the difficulty of forming sub-micron features or photo-patterns to within the tolerance of approximately 0.1 microns. Thus, CMP processes must typically transform a highly topographical substrate surface into a highly uniform, planar substrate surface (e.g., a "blanket surface").

In one conventional apparatus for planarizing microelectronic substrates, the polishing pad 21 includes a relatively soft polyurethane material. For example, the polishing pad 21 can be a model number IC 1000, manufactured by Rodel, Inc. of Newark, Del., and described in U.S. Pat. No. 5,489,233 to Cook et al. The polishing pad 21 can include surface features to increase the polishing rate, as described in Cook et al. and U.S. Pat. No. 5,177,908 to Tuttle. One drawback with the polishing pads described above is that they may tend to conform to the surface of the substrate 80 and may therefore not planarize the substrate surface uniformly. One approach for addressing this drawback is to increase the hardness and elastic modulus of the polishing pad. For example, model number OXP3000 polyurethane polishing pads, having a hardness and elastic modulus greater than the corresponding hardness and elastic modulus of the IC 1000 polishing pad, are available from Rodel, Inc.

In another conventional apparatus for planarizing substrates, the planarizing liquid 23 used with relatively soft polishing pads can include a suspension of abrasive fumed silica aggregates 27, such as are shown in FIG. 2. For example, model number ILD1300 planarizing liquids having a suspension of fumed silica aggregates 27 such as those shown in FIG. 2, are available from Rodel, Inc. The fumed silica aggregates 27 can be formed by reacting $SiCl_4$ and/or $SiH_xCl_y$ with oxygen in a burning process to form $SiO2$ particles. As the $SiO_2$ particles cool, they collide and adhere to each other, forming the three-dimensional aggregates 27 having a fractal configuration and a relatively large surface area.

One problem with the fumed silica aggregates 27 is that they can scratch or otherwise damage the substrate 80 as a result of their rough, three-dimensional shapes. One approach for addressing this problem has been to form abrasive particles having less surface area and less roughness than the silica aggregates 27. For example, planarizing liquids having spherical abrasive particles are available from Rodel, Inc. under the trade name Klebosol.

One problem with the planarizing solutions having spherical abrasive particles occurs when they are used with relatively soft polishing pads and/or with polishing pads having a porous planarizing surface. The combination of relatively soft polishing pads and planarizing liquids with spherical particles may not uniformly planarize the surfaces of microelectronic substrates because the polishing pads may conform to the surface of the substrate, as discussed above. The porous polishing pad may not planarize the substrate at an acceptable rate because the pores reduce the surface area of the polishing pad that contacts the substrate.

SUMMARY OF THE INVENTION

The present invention is directed toward methods and apparatuses for uniformly removing material from a microelectronic substrate during planarization. In one aspect of the invention, the apparatus can include a planarizing medium having a polishing pad with a generally non-porous planarizing surface and a planarizing liquid. The polishing pad can have a Shore D hardness in the range of approximately 58 to approximately 70 and/or can have a modulus of elasticity in the range of approximately $5.0 \times 10^8$ pascals to approximately $1.5 \times 10^9$ pascals. The planarizing liquid can include colloidal particles having a generally smooth external surface and being dispersed in the planarizing liquid to form a colloidal suspension.

In one aspect of the invention, the colloidal particles can have a generally spherical shape. In another aspect of the invention, the colloidal particles can have other shapes with smooth external surfaces, such as a cylindrical shape, a generally cubic shape, a generally hexagonal shape, or other closed polyhedrons. The colloidal particles can be formed from silicon dioxide, manganese oxide and/or cerium oxide and/or can have a surface area that is less than the surface area of a fumed silica aggregate of approximately the same overall size.

DETAILED DESCRIPTION OF THE INVENTION

The present invention is directed toward methods and apparatuses for planarizing a microelectronic substrate. The apparatus can include a relatively hard polishing pad in combination with a planarizing liquid having a colloidal suspension of smooth-surfaced particles. Many specific details of certain embodiments of the invention are set forth in the following description and in FIGS. 3–5B to provide a thorough understanding of such embodiments. One skilled in the art, however, will understand that the present invention may have additional embodiments and that they may be practiced without several of the details described in the following description.

Figure 3:
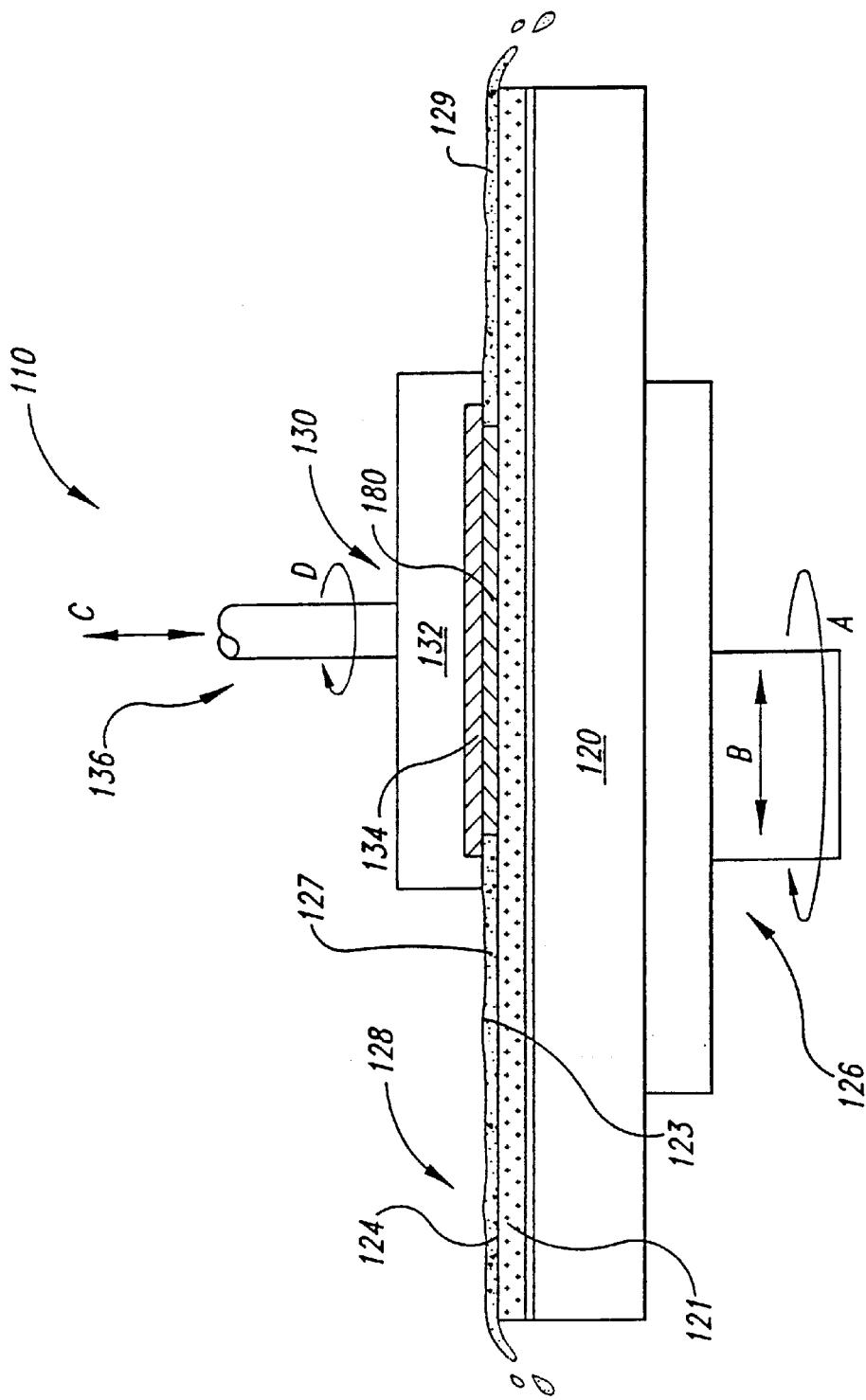
FIG. 3 is a partial cross-sectional elevation view of a chemical-mechanical planarization machine having a planarizing liquid with smooth-surfaced particles in accordance with an embodiment of the present invention.

FIG. 3 illustrates a CMP machine 110 having a platen 120 and a planarizing medium 128. In the embodiment shown in FIG. 3, the planarizing medium 128 includes a polishing pad 121 releasably attached to the platen 120, and a planarizing liquid 123 disposed on a planarizing surface 124 of the polishing pad 121. The platen 120 can be movable by means of a platen drive assembly 126 that can impart rotational motion (indicated by arrow A) and/or translational motion (indicated by arrow B) to the platen 120. As was discussed above, the CMP machine 110 can also include a carrier assembly 130 having a substrate holder 132 and a resilient pad 134 that together press a microelectronic substrate 180 against the planarizing surface 124 of the polishing pad 121. A carrier drive assembly 136 can be coupled to the carrier assembly 130 to move the carrier assembly axially (indicated by arrow C) and/or rotationally (indicated by arrow D) relative to the platen 120.

In one embodiment, the polishing pad 121 can be relatively hard and have a relatively high modulus of elasticity. For example, the polishing pad 121 can include a polyurethane material and can have a hardness, measured on the Shore D hardness scale, of between 58 and 70. In a further aspect of this embodiment, the polishing pad 121 can have a Shore D hardness of approximately 60. The polishing pad 121 can also have a modulus of elasticity of between $5.0 \times 10^8$ pascals ($7.3 \times 10^4$ psi) and $1.5 \times 10^9$ pascals ($2.2 \times 10^5$ psi). In a further aspect of this embodiment, the modulus of elasticity can be approximately $1.0 \times 10^9$ pascals ($1.5 \times 10^5$ psi). In still a further aspect of this embodiment, the polishing pad 121 can have a generally non-porous planarizing surface 124. In one embodiment, the polishing pad 121 can be a model number OXP3000 polishing pad available from Rodel, Inc. of Newark, Del., formed from generally non-porous polyurethane and having a hardness and a modulus of elasticity within the ranges identified above. In other embodiments, other polishing pads 121 from other sources can include materials other than polyurethane and can have a hardness and/or a modulus of elasticity outside the ranges identified above, so long as the polishing pads 121 are sufficiently rigid to uniformly planarize the microelectronic substrate 180.

The planarizing liquid 123 atop the polishing pad 121 can include a liquid medium 129 having a suspension of colloidal particles 127. For example, in one embodiment, the liquid medium 129 can include water and ammonia or other alkaline substances and can have a pH of approximately 11. In another embodiment, the liquid medium 129 can include acidic substances and can have a pH of approximately 2.6.

Figure 1:
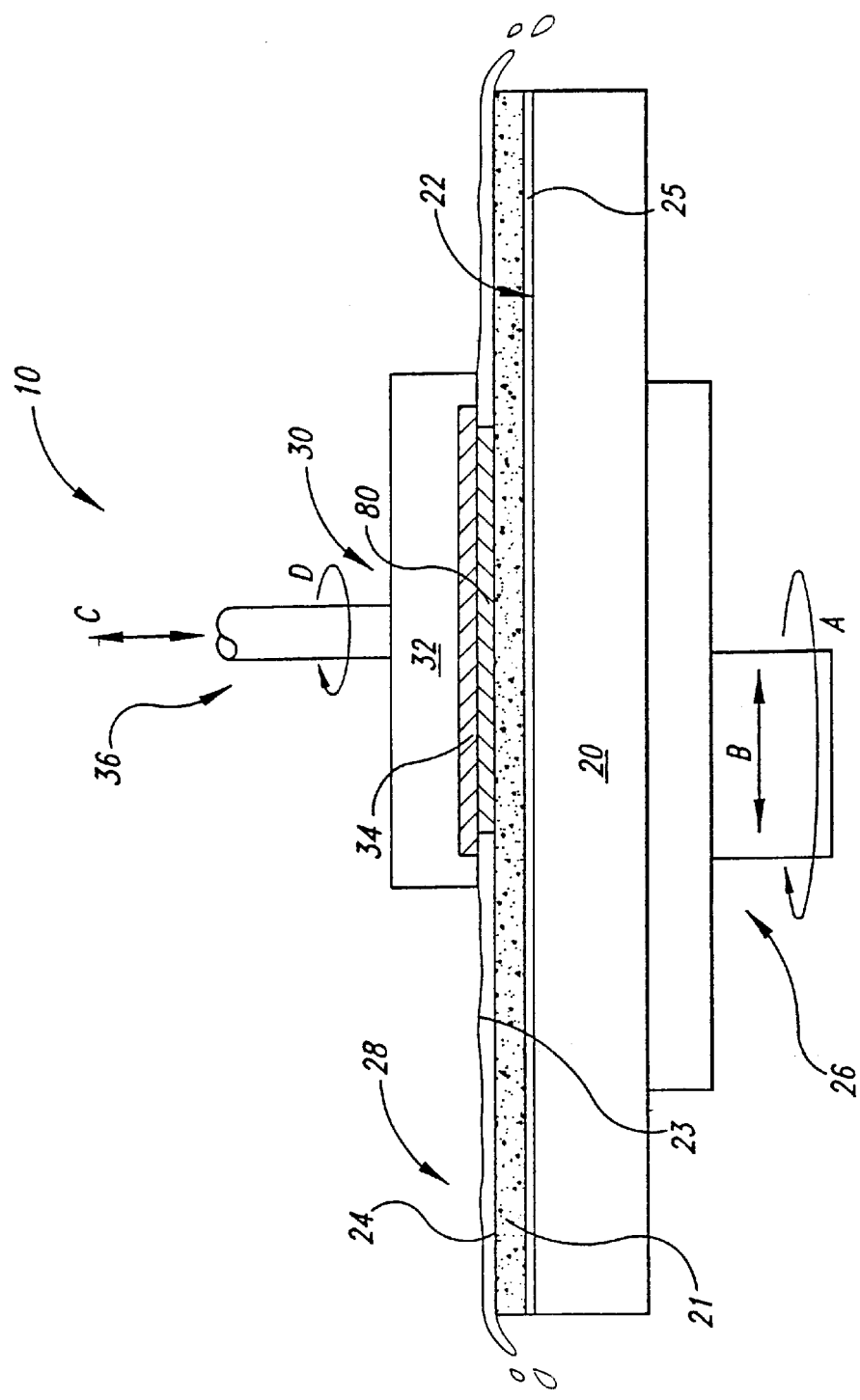
FIG. 1 is a partial cross-sectional elevation view of a chemical-mechanical planarization machine in accordance with the prior art.
Figure 2:
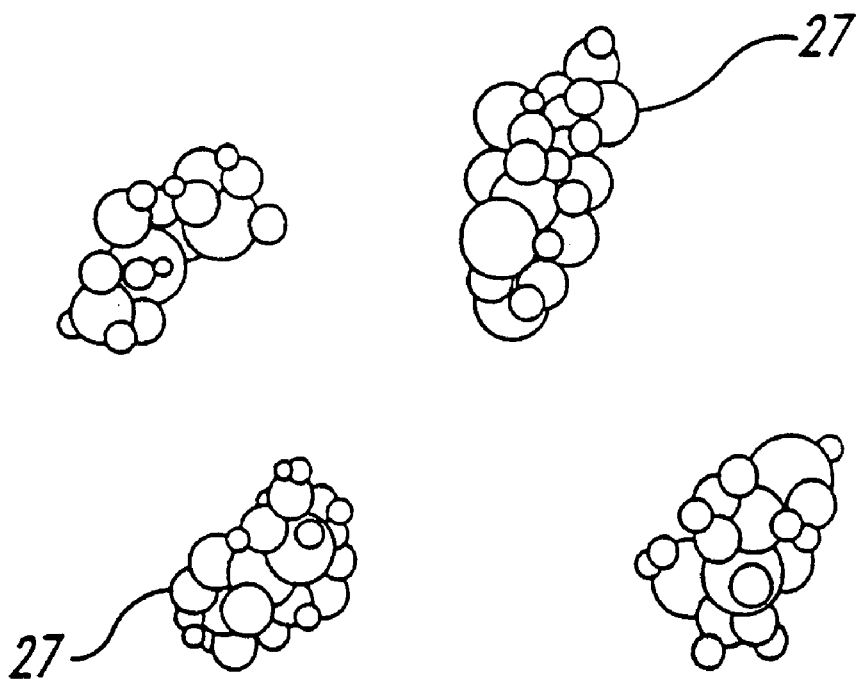
FIG. 2 is an isometric view of fumed silica aggregates in accordance with the prior art.

The colloidal particles 127 can have a variety of sizes, shapes and compositions. For example, in one embodiment, the colloidal particles 127 can be spherical and can have a diameter of between 10 nanometers and 300 nanometers. In one aspect of this embodiment, the colloidal particles 127 can have a diameter of between approximately 30 nanometers and approximately 70 nanometers. In a further aspect of this embodiment, the colloidal particles 127 can have a diameter of approximately 50 nanometers, slightly less than the overall size of the fumed silica aggregates 27 shown in FIG. 2. In other embodiments, the colloidal particles 127 can have other sizes, so long as they are small enough to remain suspended in the liquid medium 129. Planarizing liquids having liquid media 129 and colloidal particles 127 within the ranges identified above are available from Rodel, Inc. under the trade name Klebosol.

In one embodiment, the colloidal particles 127 can include silicon-based molecules, such as silicon dioxide. In other embodiments, the colloidal particles 127 can include aluminum oxide, manganese oxide and/or cerium oxide, so long as the colloidal particles 127 have a relatively small surface area, as will be discussed in greater detail below with reference to FIGS. 4A–4F.

Figure 4A:
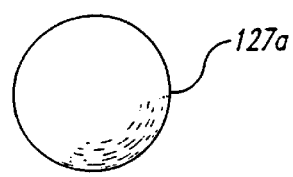
FIG. 4A is a detailed isometric view of one of the particles shown in FIG. 3 having a spherical shape in accordance with one embodiment of the invention.

FIG. 4A is an enlarged isometric view of one of the colloidal particles 127 shown in FIG. 3, having a generally spherical overall shape in accordance with an embodiment of the invention. As shown in FIG. 4A, the colloidal particle 127 has a smooth external surface. Accordingly, the surface area of the colloidal particle 127 shown in FIG. 4A is significantly less than the surface area of a fused aggregate having approximately the same overall dimensions, for example, the fused silica aggregates 27 shown in FIG. 2.

Figure 4B:
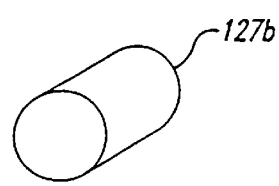
FIG. 4B is a detailed isometric view of one of the particles shown in FIG. 3 having a cylindrical shape in accordance with another embodiment of the invention.
Figure 4C:
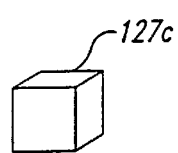
FIG. 4C is an isometric view of one of the particles shown in FIG. 3 having a cubic shape in accordance with still another embodiment of the invention.
Figure 4D:
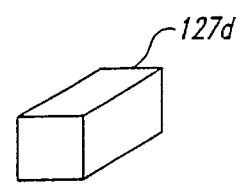
FIG. 4D is an isometric view of one of the particles shown in FIG. 3 having an elongated rectangular shape in accordance with yet another embodiment of the invention.
Figure 4E:
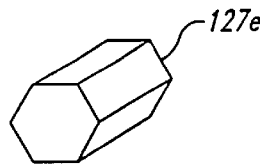
FIG. 4E is an isometric view of one of the particles shown in FIG. 3 having a hexagonal shape in accordance with yet another embodiment of the invention.
Figure 4F:
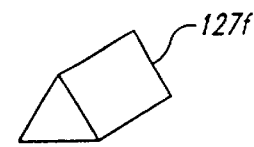
FIG. 4F is an isometric view of one of the particles shown in FIG. 3 having a triangular cross-sectional shape in accordance with still another embodiment of the invention.

In other embodiments, the colloidal particle 127 can have other shapes that similarly have smooth external surfaces with relatively low total surface area. The surfaces can be generally flat or convex, as opposed to concave, and/or can be generally free of convolutions. For example, the planarizing liquid 123 shown in FIG. 3 can include generally cylindrical colloidal particles 127b as shown in FIG. 4B, generally cubic colloidal particles 127c as shown in FIG. 4C, and/or generally rectangular colloidal particles 127d as shown in FIG. 4D. In still further embodiments, the planarizing liquid 123 shown in FIG. 3 can include colloidal particles 127e having a generally hexagonal shape as shown in FIG. 4E, and/or colloidal particles 127f having a generally triangular cross-sectional shape as shown in FIG. 4F. In still further embodiments, the colloidal particles 127 can have other closed polyhedral shapes, so long as the colloidal particles have generally smooth exterior surfaces with a relatively low surface area. The shapes of specific colloidal particles 127 can depend on the material properties of the particles, the manufacturing processes used to form the particles, and other variables. For example, the colloidal particles 127 can be formed in-situ by "growing" the colloidal particles 127 in solution. Alternatively, the colloidal particles 127 can be formed ex-situ, using a process such as pyrolysis, ablation, vapor phase condensation, grinding or milling, and can then be added to a liquid solution. In any case, the overall length or diameter of the particles shown in FIGS. 4A–4F can be within the ranges discussed above with reference to FIG. 3.

An advantage of the combination of the hard polishing pad 121 and the smooth-surfaced colloidal particles 127 shown in FIGS. 3–4F is that together they can uniformly planarize the microelectronic substrate 180 without scratching or otherwise damaging the surface of the substrate 180. For example, it has been observed in some cases that planarizing with the hard polishing pad 121 together with the smooth-surfaced colloidal particles 127 can produce a surface finish on the substrate 180 that is smoother than that obtained by planarizing with a hard polishing pad in combination with fumed silica aggregates. It is believed that this effect may result because the smooth-surfaced colloidal particles 127 may have a lesser tendency than the silica aggregates to gel or otherwise form agglomerations.

A further advantage of the combination of the hard polishing pad 121 and the smooth-surfaced colloidal particles 127 is that they can reduce the potential for scratching the microelectronic substrate 180 during planarization. It is believed that scratches in the microelectronic substrate 180 may be caused by the rough surfaces of the fumed silica aggregates 27 (FIG. 2) and/or by large agglomerations of the aggregates 27 that become caught between the microelectronic substrate 180 and the polishing pad 121 (FIG. 3). The colloidal particles 127 may reduce the likelihood of damaging the microelectronic substrate 180 because individual colloidal particles 127 have smooth surfaces that tend not to scratch the surface of the microelectronic substrate. Furthermore, the colloidal particles 127 may be less likely to form agglomerations because they do not have fractal shapes that tend to link together.

Still another advantage is that, by reducing the likelihood for forming scratches on the microelectronic substrate 180, the combination of the hard polishing pad 121 and the smooth-surfaced colloidal particles 127 may also reduce the likelihood for forming cracks in the microelectronic substrate 180. Such cracks can damage structures of the microelectronic substrate 180, and can also create channels through which chemicals, such as those used during CMP processing, can damage structures beneath the surface of the microelectronic substrate 180.

Yet another advantage of an embodiment having a polishing pad 121 with a non-porous planarizing surface 124 is that the combination of such a polishing pad with the smooth-surfaced colloidal particles can increase the rate at which the microelectronic substrate 180 is planarized while reducing the likelihood of scratching or otherwise damaging the microelectronic substrate 180. Such a combination may be particularly advantageous when compared with a porous polishing pad such as an ESM polishing pad, available from James H. Rhodes and Co. of Franklin Springs, N.Y. Such porous polishing pads have a reduced surface area in contact with the microelectronic substrate 180 and accordingly can have a slower planarization rate.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for removing material from a surface of a microelectronic substrate, comprising:

selecting a polishing pad to include a polyurethane material having a generally non-porous planarizing surface, a modulus of elasticity of approximately $1.0 \times 10^9$ pascals, and a Shore D hardness of approximately 60;

selecting a planarizing liquid to include a colloid having generally spherically shaped silicon dioxide colloidal particles having a surface roughness with a mean height of between 0.01% and 10% of the particles mean diameter;

disposing the planarizing liquid and colloidal particles on a planarizing surface of the polishing pad;

engaging the surface of the microelectronic substrate with the planarizing liquid and the planarizing surface of the polishing pad; and moving at least one of the microelectronic substrate and the polishing pad relative to the other of the microelectronic substrate and the polishing pad to remove material from the surface of the microelectronic substrate.

2. The method of claim 1 wherein selecting the planarizing liquid includes selecting the colloidal particles to have a mean diameter in the range of approximately 10 nanometers to approximately 300 nanometers.

3. The method of claim 1 wherein selecting the planarizing liquid includes selecting the colloidal particles to have a mean diameter of approximately 50 nanometers.

4. The method of claim 1 wherein selecting the planarizing liquid includes selecting the colloidal particles to have a surface area less than a surface area of a fumed silica aggregate having approximately the same overall size.

5. The method of claim 1, further comprising forming the colloidal particles external to the planarizing liquid and combining the colloidal particles with the planarizing liquid.

* * * * *

UNITED STATES PATENT AND TRADEMARK OFFICE
CERTIFICATE OF CORRECTION

PATENT NO. : 6,652,363 B2
DATED : November 25, 2003
INVENTOR(S) : Stephen J. Kramer and Scott Meikle It is certified that error appears in the above-identified patent and that said Letters Patent is hereby corrected as shown below:

Column 1,
Line 23, "emission display; and" should read -- emission display and --

Column 2,
Line 37, "to form SiO2" should read -- to form $SiO_2$ --

Column 5,
Line 45, "planarizing. with" should read -- planarizing with --

Column 6,
Line 41, "of the particles mean" should read -- of the particle mean --

Signed and Sealed this

Fourteenth Day of September, 2004

JON W. DUDAS
*Director of the United States Patent and Trademark Office*